(12) United States Patent
Brannon

(10) Patent No.: US 10,587,024 B2
(45) Date of Patent: Mar. 10, 2020

(54) HERMETIC SEALING OF CERAMIC FILTERS

(71) Applicant: LGS INNOVATIONS LLC, Herndon, VA (US)

(72) Inventor: Alan Scott Brannon, Denver, CO (US)

( * ) Notice: Subject to any disclaimer, the term of this patent is extended or adjusted under 35 U.S.C. 154(b) by 0 days.

(21) Appl. No.: 15/786,311

(22) Filed: Oct. 17, 2017

(65) Prior Publication Data

US 2018/0115035 A1 Apr. 26, 2018

Related U.S. Application Data

(60) Provisional application No. 62/411,343, filed on Oct. 21, 2016.

(51) Int. Cl.
| | | |
|---|---|---|
| *H01P 1/205* | (2006.01) | |
| *H01P 1/213* | (2006.01) | |
| *H01P 7/10* | (2006.01) | |
| *H05K 1/02* | (2006.01) | |
| *H01P 7/04* | (2006.01) | |

(52) U.S. Cl.
CPC .......... *H01P 1/2056* (2013.01); *H01P 1/2136* (2013.01); *H01P 7/04* (2013.01); *H01P 7/10* (2013.01); *H05K 1/0243* (2013.01); *B01D 2201/34* (2013.01); *H05K 2201/1006* (2013.01)

(58) Field of Classification Search
CPC ......... H01P 1/2056; H01P 7/04; H01P 1/2136
USPC ........................................ 333/206, 222, 134
See application file for complete search history.

(56) References Cited

U.S. PATENT DOCUMENTS

| | | | |
|---|---|---|---|
| 6,177,851 B1 * | 1/2001 | Komatsu | ............ H01R 13/6581 333/202 |
| 7,898,367 B2 | 3/2011 | Morga et al. | |
| 8,261,714 B2 | 9/2012 | Nummerdor | |
| 8,269,579 B2 | 9/2012 | Nummerdor et al. | |
| 8,294,532 B2 | 10/2012 | Nummerdor | |
| 9,030,272 B2 | 5/2015 | Nummerdor | |
| 2007/0048898 A1 | 3/2007 | Carlson et al. | |

(Continued)

OTHER PUBLICATIONS

"Hermetic Connectors", Copyright 2010, http://www.amphenol.co.uk/hermetic-connectors.html, retrieved on Sep. 6, 2017.

(Continued)

*Primary Examiner* — Benny T Lee
(74) *Attorney, Agent, or Firm* — Baker & Hostetler LLP

(57) ABSTRACT

The present application is directed to an enclosure for hermetically sealing ceramic filters. The enclosure includes a container body with a hollow cavity for receiving electronic components. A container lid is hermetically sealed to the body to maintain a controlled environment. A connector allows for communicating between the electronic components received within the enclosure and other electronic components located outside the enclosure. The enclosure also includes a filter having a block of dielectric material with a top surface including a patterned region, a bottom surface, and side surfaces. A through-hole extends through the block from the top surface to the bottom surface. The through-hole is partially surrounded by the patterned region. A wall extends from the top surface, and has an inner surface, an outer surface, and a roof. The application is also directed to a system including a printed circuit board and a filter provided in the enclosure.

20 Claims, 6 Drawing Sheets

(56) References Cited

U.S. PATENT DOCUMENTS

| | | |
|---|---|---|
| 2008/0169521 A1 | 7/2008 | Foster et al. |
| 2008/0271908 A1 | 11/2008 | Yamamoto et al. |
| 2009/0146761 A1 | 6/2009 | Nummerdor |
| 2010/0006315 A1 | 1/2010 | Kumatani et al. |
| 2011/0048757 A1 | 3/2011 | Yamamoto et al. |
| 2011/0094862 A1 | 4/2011 | May et al. |
| 2011/0114355 A1 | 5/2011 | Bauer et al. |
| 2012/0326805 A1 | 12/2012 | Nummerdor |
| 2012/0326806 A1 | 12/2012 | Nummerdor |
| 2013/0038404 A1 | 2/2013 | Nummerdor |

OTHER PUBLICATIONS

HC/UM Types, http://www.us.schott.com/epackaging/english/fc/hc_um_type.html, retrieved on Mar. 13, 2012.

Hermetic Packages for Quartz Crystals, Ceramic Resonators, Monolithic Filters, http://www.z-mars.ru/en/?category=111, retrieved on Apr. 17, 2017.

Michael A. Lieberman, et al., "Principles of Plasma Discharges and Materials Processing, 2nd Edition", Hoboken, N.J., Wiley-Interscience, pp. 544-546. ISBN: 978-0-471-72001-0. OCLC 59760348, Apr. 2005.

\* cited by examiner

HERMETIC SEALING OF CERAMIC FILTERS

CROSS-REFERENCE TO RELATED APPLICATIONS

This application claims the benefit of priority of U.S. Provisional Application No. 62/411,343 filed Oct. 21, 2016, entitled "Hermetic Sealing of Ceramic Filters," the content of which is incorporated by reference in its entirety herein.

FIELD

This application is generally related to an apparatus and method for hermetically sealing ceramic filters.

BACKGROUND

A variety of technologies implement ceramic filters, including both monoblock filters and duplex filters. For instance, transmitters and receivers in radio equipment utilize the same antenna, and thus the transmission network controls both the transmission signal and the receiving signal. Ceramic filters, such as duplex ceramic filters including two individual band-pass filters, are typically employed in such radio equipment to reduce interference. One filter connects the receiving branch and has a center frequency and bandwidth corresponding to the receiving band. The other filter connects the transmission branch and has a center frequency and bandwidth corresponding to the transmission band. Conventional ceramic filters include a dielectric ceramic material for the main body upon which metallic materials are applied for producing conducting paths. These paths define the performance of the filter and are used for realization of pads or other isolated conducting areas that contact the printed circuit board or other interface material.

Air cavity duplex filters are often used in high power or macro-class base transceiver stations (BTS), which operate at higher power levels (i.e., on the order of Watts to many Watts of transmitted RF power). Such filters include multiple resonators which, when tuned properly, can operate in concert to achieve desired filter performance needs. The implementations inherent in air dielectric filters are such that sufficient separations between conductive elements can be achieved in order to prevent arcing between elements when the filters are operated at high power levels. However, air dielectric filters are large and heavy devices which make them prohibitive for use in applications that require small size and low weight. Thus, emerging ceramic filter technologies may be utilized to meet those needs in many applications. These ceramic filters have the characteristic that they are much smaller and weigh much less than conventional air dielectric filters. However, ceramic filters are limited to operation at peak and average power levels significantly lower than those offered by air dielectric filters. Moreover, recessed top pattern (RTP) filters are often limited by peak power handling due to the possibility of electrical arcs, which is strongly dependent on environmental factors such as humidity and air pressure.

Accordingly, since peak power handling of RTP filters is limited by environment conditions such as humidity and air pressure, there is a need to provide ceramic filters in a controlled local environment for higher power handling. There is a further need to ensure that such a controlled local environment for the ceramic filter does not change over time regardless of the conditions of the exterior environment.

SUMMARY OF THE INVENTION

The foregoing needs are met, to a great extent, by the invention, with an apparatus and method for using a hermetically sealed enclosure for ceramic filters in order to extend the operational power levels achievable with ceramic filters, including RTP duplex filters.

One aspect of the application is directed to an enclosure comprising a container body defining a hollow cavity configured to receive electronic components; a container lid hermetically sealed to the container body for maintaining a controlled environment within the enclosure; a connector provided on the container body to permit communication between the electronic components received within the enclosure and other electronic components located outside the enclosure; and a filter provided within the hollow cavity of the container body and isolated from an outside environment. The filter includes a block of dielectric material with a top surface including a patterned region, a bottom surface, and side surfaces; a through-hole extending through the block from the top surface to the bottom surface, the through-hole being partially surrounded by the patterned region; and a wall extending from the top surface, the wall having an inner surface, an outer surface, and a top rim.

The connector is hermetically sealed to the container body for maintaining the controlled environment within the enclosure. The enclosure further includes a vent port provided on the container body to permit the introduction of a gas into the enclosure and/or the evacuation of a gas out of the enclosure. The vent port includes a hermetically sealed vent cap for maintaining the controlled environment within the enclosure. The wall includes a first post formed between two spaced-apart slots extending from the inner surface to the outer surface, and a second post formed between two other spaced-apart slots extending from the inner surface to the outer surface. The enclosure also includes a printed circuit board having a top surface and including an input pad and an output pad, wherein the input and output pads contact the first and second posts of the filter. Further, a thermal contact may be disposed within the hollow cavity and located between the filter and the container lid for conducting heat away from the filter and the printed circuit board and toward the lid.

The bottom surface, side surfaces, outer surface, and top surface may have a first coating of silver and glass frit. The patterned region, through-hole and inner surface may have a second coating of silver and glass frit. In some implementations, the filter is a duplex filter. A filler gas may be provided to prevent or minimize electrical arcing between the electronic components. The filler gas may be nitrogen or sulfur hexafluoride, for example. The wall may extend along a perimeter of the top surface and includes a first slot extending therethrough from the inner surface to the outer surface, and a second, spaced-apart slot extending from the inner surface to the outer surface. Further, the wall includes a post formed between the first and second slots. The patterned region of the top surface continuously extends to the post.

Another aspect of the application is directed to a system including a hermetically sealed enclosure configured to maintain a controlled environment; a printed circuit board disposed within the enclosure, the printed circuit board having a top surface and including an input pad and an output pad; and a filter mounted to the printed circuit board. The filter includes a block of dielectric material with a top surface including a patterned region, a bottom surface, and side surfaces. A through-hole extends through the block from the top surface to the bottom surface. A wall extends from the top surface, the wall having an inner surface, an outer surface, and a top rim, the wall including a first post formed between two spaced-apart slots extending from the inner surface to the outer surface, and a second post formed between two other spaced-apart slots extending from the inner surface to the outer surface. The bottom surface, side surfaces, outer surface and top surface have a first coating, and the patterned region, through-hole and inner surface have a second coating, and the first and second coatings have different compositions. An environmental sensor may be mounted on the printed circuit board and configured to monitor internal pressure, humidity, and/or temperature within the enclosure. A memory unit may be mounted on the printed circuit board and configured to communicate with the environmental sensor and/or record events that indicate a failure of the hermetic seal of the enclosure.

A further aspect of the application is directed to a method of communicating a signal to and from a node. The method includes the step of providing a hermetically sealed enclosure containing a duplex filter mounted to a printed circuit board, the duplex filter including a pair of dielectric material blocks. Each block has a top surface including a patterned region, a bottom surface, and side surfaces. Each block also has a through-hole extending through the block from the top surface to the bottom surface, the through-hole being partially surrounded by the patterned region. Each block also has a wall extending from the top surface, the wall having an inner surface, an outer surface, and a top rim. A cavity is a defined by the top surface and the wall. The method also includes the steps of receiving the signal into the duplex filter from a first node outside of the enclosure, passing the signal through the through-hole, and transmitting the signal from the duplex filter to a second node outside of the enclosure. Another step includes monitoring and recording internal pressure, humidity, and/or temperature within the enclosure.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

BRIEF DESCRIPTION OF THE DRAWINGS

In order to facilitate a fuller understanding of the invention, reference is now made to the accompanying drawings, in which like elements are referenced with like numerals. These drawings should not be construed as limiting the invention and intended only to be illustrative.

DETAILED DESCRIPTION OF THE INVENTION

Figure 1:
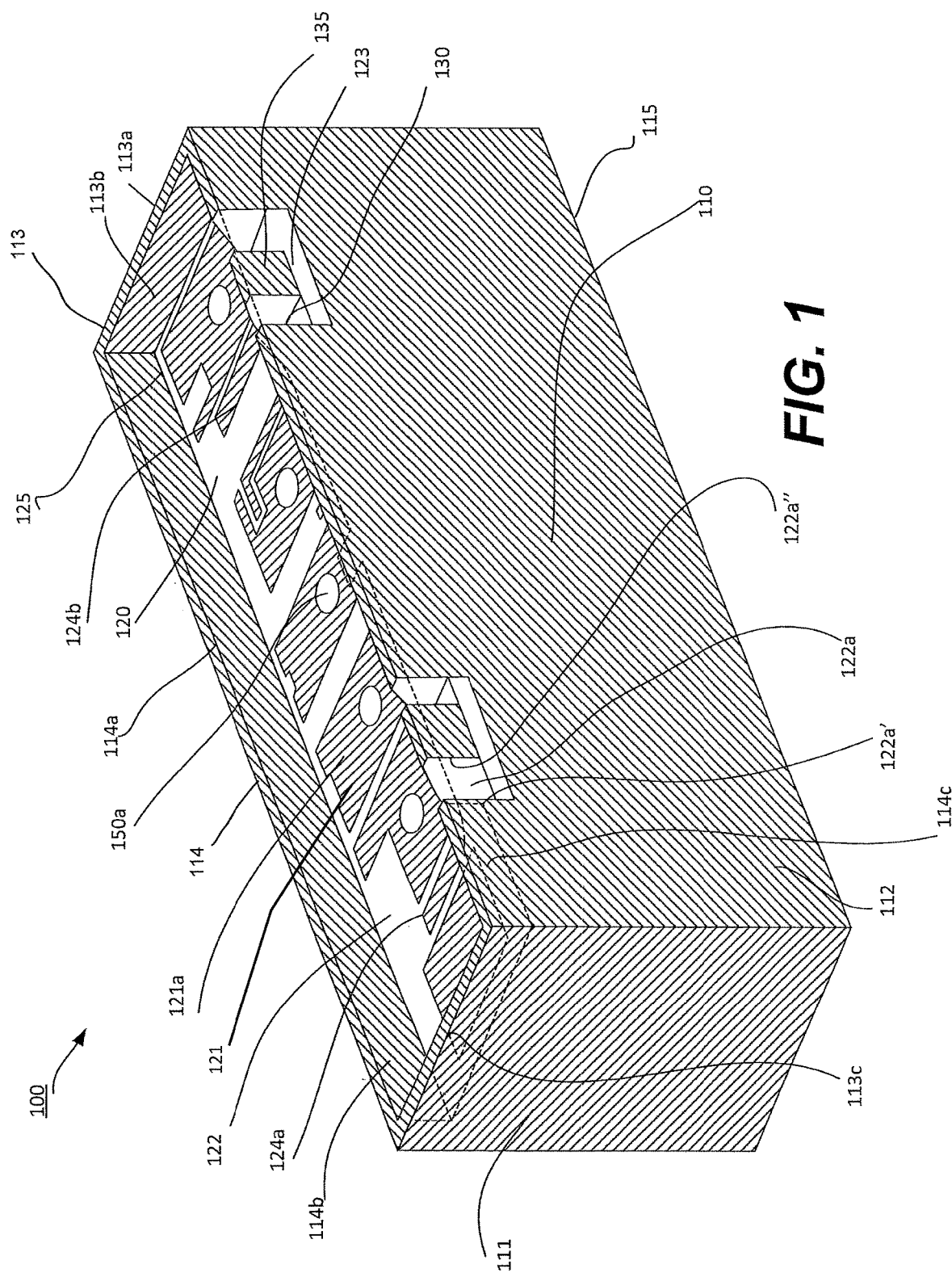
FIG. 1 illustrates a filter according to an aspect of the application.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as in the abstract, are for the purpose of description and should not be regarded as limiting.

Reference in this application to "one embodiment," "an embodiment," "one or more embodiments," or the like means that a particular feature, structure, or characteristic described in connection with the embodiment is included in at least one embodiment of the disclosure. The appearances of, for example, the phrases "an embodiment" in various places in the specification are not necessarily all referring to the same embodiment, nor are separate or alternative embodiments mutually exclusive of other embodiments. Moreover, various features are described which may be exhibited by some embodiments and not by the other. Similarly, various requirements are described which may be requirements for some embodiments but not by other embodiments.

It has been determined by the inventors and described herein that the inventive techniques provide an enclosure around the ceramic filter, such as a duplex filter and/or its circuit board that 1) provides a hermetic seal around the duplex filter with options for a) maintaining atmospheric air pressure and humidity, and/or b) providing a pressurized environment, or c) providing a pressurized and dry environment, and/or d) providing an evacuated environment, and/or e) providing a controlled gaseous environment such as nitrogen or sulfur hexafluoride; and that 2) permits RF, DC, and/or control signals to pass through. Additional inventive techniques of the present application include i) measuring environmental conditions over time, ii) recording such conditions, iii) setting a threshold on such conditions for warning users of exceeded limits, iv) providing signals to automatically reduce power so that no arc occurs, and v) including other circuitry in such enclosure. A further major benefit of applying the techniques described in this application to filters includes increasing their power handling capabilities.

Ceramic filters generally include a single type of material for all conduction paths, pads and other conductive elements. Typically, conducting-type material is deposited on the device through a process known as electroding. Often, there is a need for soldering or epoxy-attaching given devices to a printed circuit board. The strength of the conductor bond between a device and the board requires using a conducting material containing glass frit in combination with more pure silver conductive material. The conductivity of materials with a higher glass frit content is significantly less than more pure silver with less frit content by about 10 fold, while adhesion of the higher frit silver material is 6 fold as compared to that of pure silver.

Generally, a pattern of metallized and un-metallized areas is defined on a filter. The pattern includes a recessed area of metallization that covers at least a portion of the top surface and areas which cover the bottom and side surfaces, the through-holes, and at least a portion of the walls or posts.

Silver (i.e., Ag) material with a higher frit content may be applied in areas of the filter where strong adhesion to a circuit board is required. Other metalized areas are advantageously electroded with more pure silver containing less glass frit in high current areas where mechanical strength is not needed. Selective masking of these filter locations coupled with plural coating steps may be employed. This technique advantageously enables lower losses due to the lower resistivity of a more purer silver.

FIG. 1 illustrates a radio frequency (RF) ceramic filter 100 in accordance with an aspect of the application. The filter may be made formed in any shape. In an exemplary embodiment, the filter 100 has an elongate, parallelepiped or box-shaped rigid block or core 110 comprised of a ceramic dielectric material having a desired dielectric constant.

The filter 100 includes four side surfaces. Two of the four side surfaces are minor side surfaces 111. The other two of the four side surfaces are major side surfaces 112. The filter 100 also includes a bottom surface 115 and a top-recessed surface 120. The top surface 120 is generally parallel and opposed to the bottom surface.

The filter 100 also includes four generally planar walls that extend upwardly from the top surface 120. In one embodiment, the planar walls extend upwardly and/or outwardly along a perimeter of the top surface. In another embodiment, the planar walls are unitary portions of the major side surface 112 and minor side surface 111. Planar walls of the minor side surfaces are 113, and planar walls of the major side surfaces are 114. Walls 113, 114, and top surface 120 define a cavity 125. Top rims 113a of wall 113 and top rims 114a of wall 114 form a peripheral rim of a predetermined thickness. The thickness of the top rim is dependent upon the width and length of the cavity 125.

Inner walls 113b of wall 113 of the minor surface 111, inner walls 114b of wall 114 of the major surface 112, and the top surface 120 can be plated or deposited with a first coating containing less frit content. The first coating will be described in more detail below. In an embodiment, outer walls 113c and 114c of walls 113 and 114 are coextensive and coplanar with major surface 111 and minor surface 112, respectively. In one embodiment, the top rims 113a, 114a are planar. In another embodiment, the top rim slopes downward from the inner to outer surfaces of the walls 113, 114. In yet another embodiment, the top rim slopes upward from the inner to outer surfaces of the walls 113, 114. The slope is envisaged to be any angle.

As shown in FIG. 1, planar wall 114 includes plural, spaced-apart slots 130. For example, the slots extend through the planar wall 114 from the inner surface 114b to the outer surface 114c. The slots 130 may have similar or different lengths extending between two minor side surfaces 111. In an embodiment, a post 135 may be formed in the planar wall 114 between two spaced-apart slots 130. The plural posts 135 may have similar or different lengths.

The top surface 120 may include plural through-holes 150a. The through-holes 150a extend from the top surface 120 to the bottom surface 115 (not shown) of the body 100. The through-holes 150a act as resonators. The though-holes are metallized. In an embodiment, the through-holes 150a are aligned in a spaced-apart, co-linear relationship and are also equal distances from the side surfaces. Each of through-holes 150a is defined by an inner cylindrical metallized side-wall surface.

Top surface 120 additionally defines a surface-layer recessed pattern of electrically conductive metallized area or pattern 121 and insulative, un-metallized area or pattern 122. The metallized areas 121 are preferably a surface layer of conductive silver-containing material. Recessed pattern 121 defines a wide area or pattern of metallization that covers the surface. In an embodiment, the recessed pattern 121, through-holes 150a, and inner walls 113b, 114b are deposited with a first coating including a metal and frit. More specifically, the metal is a precious metal. Even more specifically, the metal is silver (Ag). Meanwhile, the bottom surface 115, side surfaces 111, 112, outer planar walls 113c, 114c, and top rims 113a, 114a are deposited with a second coating including a metal and frit. The metal may be precious. In particular, the metal is silver. The frit content in the second coating is greater than the first coating.

In an embodiment, the frit content is at least 20% greater in the second coating. In an exemplary embodiment, the frit content is at least 25% greater in the second coating. In a further exemplary embodiment, the frit content is at least 30% greater in the second coating. In a yet a further exemplary embodiment, the frit content is at least 35% greater in the second coating. In even a further exemplary embodiment, the frit content is at least 40% greater in the second coating. The first coating also extends contiguously within the through-holes 150a from the top surface 120 to the bottom surface 115.

In an embodiment, a portion of metallized area 121 is present in the form of resonator pads (121a is representative as illustrated by the reference indicator in the drawing). Each of these resonator pads partially surrounds a through-hole (150a is representative as illustrated by the reference indicator in the drawing) opening located on the top, recessed surface 120. In an exemplary embodiment, each resonator pad entirely surrounds one of through-holes, respectively. The resonator pads 121a are contiguous with the metallization area 121 that extends through the inner surfaces of the through-holes. Resonator pads (121a is representative as illustrated by the reference indicator in the drawing) are shaped to have predetermined capacitive couplings to adjacent resonators and other areas of surface-layer metallization.

An un-metallized area or pattern 122 extends over portions of top surface 120. Un-metallized area 122 surrounds all of the metallized resonator pads 121a. In addition, portions of inner planar walls 113b, 114b and top rims 113a, 114a are un-metalized.

Un-metallized area 122 extends on the top surface 120 in slot 122a (122a is representative as illustrated by the reference indicator in the drawings). The un-metallized area 122 also extends onto side wall slot portions 122a', 122a" (122a' and 122a" are representative). Side wall slot portions 122a' and 122a" define opposed side walls of the post 135.

In another embodiment, un-metallized area 122 also can also extend onto a portion 123 of side surface 112 located below the post 135. Portion 123 can also extend below the slots 130. These un-metallized areas are co-extensive or joined or coupled with each other in an electrically non-conducting relationship. The surface-layer pattern additionally defines a pair of isolated conductive metallized areas 124a, 124b for input and output connections to filter 100. An input connection area or electrode 124a and an output connection area or electrode 124b are defined on top surface 120 and extend onto a portion of the planar wall 114 and side surface 112. The electrodes can serve as surface mounting conductive connection points or pads or contacts. Electrodes 124a, 124b are located adjacent and parallel to side surfaces 111. Each of the electrodes is located between two resonator pads 121a. Further, the electrodes 124a, 124b are surrounded on all sides by un-metallized areas 122.

In another embodiment, the recessed surface pattern 120 includes metallized areas 121 and un-metallized areas 122. As a result, metallized areas are spaced apart from one another and capacitively coupled. The amount of capacitive coupling is roughly related to the size of the metallization areas and the separation distance between adjacent metallized portions as well as the overall core configuration and the dielectric constant of the core dielectric material. Similarly, surface pattern 120 and the through holes 150a also create inductive coupling between the metallized areas.

Figure 2:
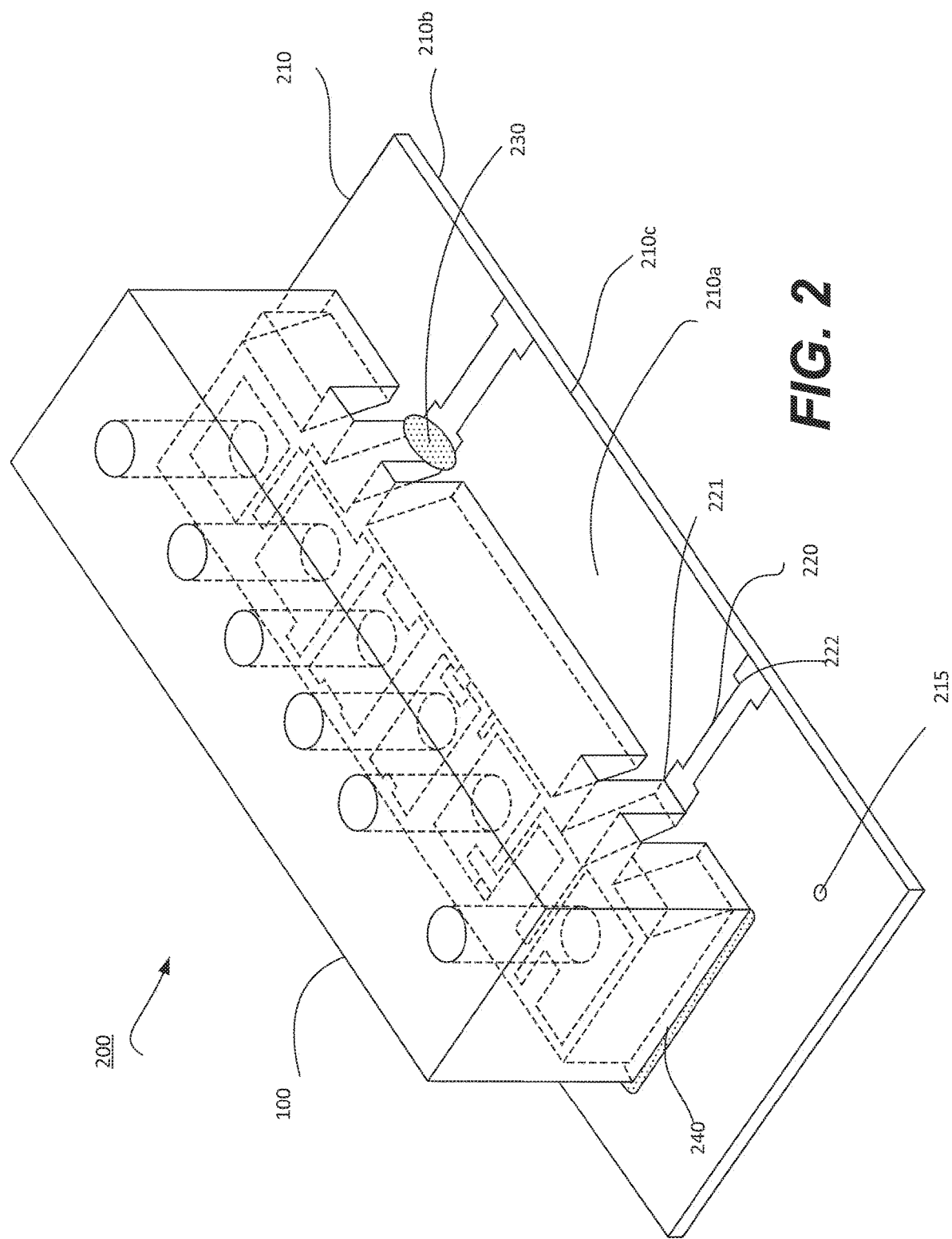
FIG. 2 illustrates a filter on a printed circuit board according to an aspect of the application.

According to another aspect, filter 100 is illustrated as being mounted to a generally planar rectangular shaped circuit board 210 as shown as the system 200 in FIG. 2. In one embodiment, circuit board 210 is a printed circuit board having a top or top surface 210a, bottom or bottom surface 210b and sides or side surfaces 210c. Circuit board 210 has a height of a predetermined thickness. Circuit board 210 also includes plated through-holes 215 that form an electrical connection between the top and the bottom of the circuit board 210. Several circuit lines 220 and input/output connection pads 221 can be located on top the top surface and connected with terminals 222. Circuit lines 220, connection pads 221, and terminals 222 can be formed, for example, from metal such as copper. Terminals 222 connect the filter 100 with an external electrical circuit (not shown). A post of the filter 100 can be attached to the PCB 210 at the connection pad(s) 221 by solder 230. In an embodiment, one or both of the input 124a electrode and output electrode 124b of FIG. 1 can be attached to the solder 230.

Circuit board 210 has a generally rectangular-shaped ground ring or line 240. The ground ring or line 240 can be disposed on the top surface. The line 240 can be formed around the rim of the filter. The ground ring can be formed from copper. Next, the filter 100 can be placed on top of the circuit board 210 such that input electrode portion 124a and output electrode portion 124b are aligned with connection pads 221. Circuit board 210 and filter 100 may arranged in a reflow oven to melt and reflow the solders.

As illustrated in FIG. 2, filter 100 is mounted to the board 210 in a top side down relationship. As a result, the top surface 120 is located opposite, parallel to, and spaced from the top 210 of board and the top rims of 113a, 114a of the filter (shown in FIG. 1) are soldered to the top of the PCB shown in FIG. 2. In this relationship, cavity 125 (shown in FIG. 1) is partially sealed to define an enclosure defined by the top, recessed surface 120 (shown in FIG. 1), the board surface 210a, and the walls 111, 112 of the filter. It is further noted that, in this relationship, the through-holes in filter are oriented in a relationship generally normal to the board surface 210a.

The use of filter 100 with recessed top surface pattern 120 facing and opposite the board provides improved grounding and off band signal absorption; confines the electromagnetic fields within cavity 125. The arrangement also prevents external electromagnetic fields outside of cavity 125 from causing noise and interference such that the attenuation and zero points of the filter are improved. The arrangement of the cavity also prevents the electromagnetic fields from interfering and coupling with other components mounted near filter 100. The technology allows the same footprint to be used across multiple frequency bands. In addition, during solder reflow, filter 100 tends to self-align with the ground ring 240 on the circuit board. The filter exhibits improved self-alignment since the surface tension of the liquid solder during reflow is distributed equally around top rim between the ground ring and rim providing self-centering of the filter's core 110.

The use of a filter 100 defining a cavity and a recessed top surface pattern facing and opposite the board eliminates the need for a separate external metal shield or other shielding as currently used to reduce spurious electromagnetic interference incurred. Further, the recessed pattern creates a resonant circuit that includes a capacitance and an inductance series connected to ground. The shape of the pattern determines the overall capacitance and inductance values. The capacitance and inductance values are designed to form a resonant circuit that suppresses the frequency response at frequencies outside the passband including various harmonic frequencies at integer intervals of the passband.

Figure 3:
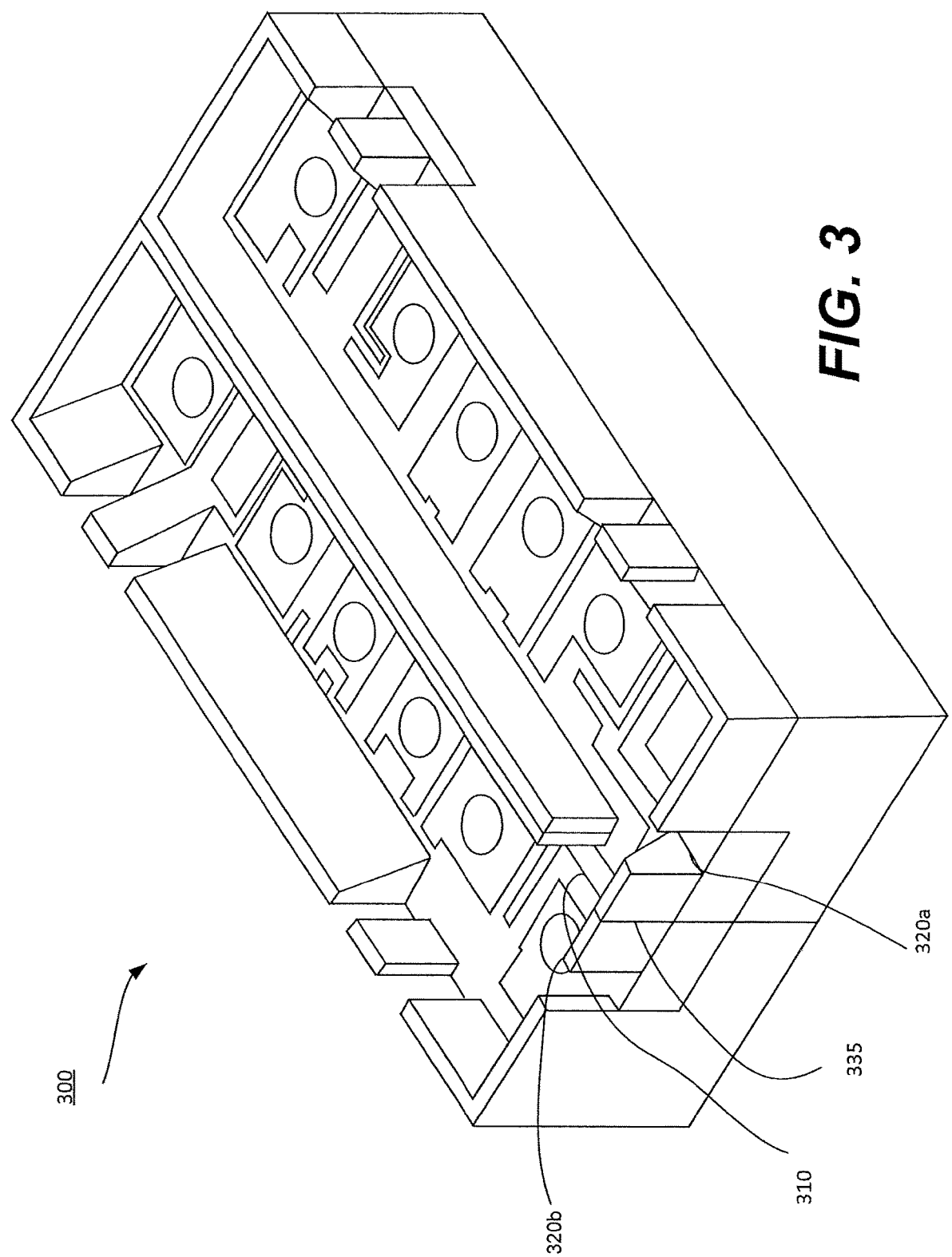
FIG. 3 illustrates a duplex filter according to aspect of the application.

According to another embodiment as shown in FIG. 3, a duplex filter 300 is described and includes two filters 100 (shown in FIG. 1). Here, the two simplex filters are adjoined along major side surfaces 112 creating a duplex filter. In particular, in each filter 100, a slot 310 is formed in the opposing walls 114 and having a post 135 formed therein (see also FIG. 1). Because the slot 310 is formed between two filters 100, the thickness of the slot 310 is twice the thickness of a slot 130 of each filter.

In an embodiment, each of the filters 100 in the duplex filter 300 shown in FIG. 3 includes a slot 320a and 320b on a minor side surface 111 (see also FIG. 1). A post 335 is formed between the two slots 320a, 320b. In one embodiment, a portion of an inner wall of post 335 is located adjacent slot 310. A top surface of the post extends between minor side surfaces 111 of two filters. A thickness of the post may vary between the post's inner and outer walls.

Figure 4:
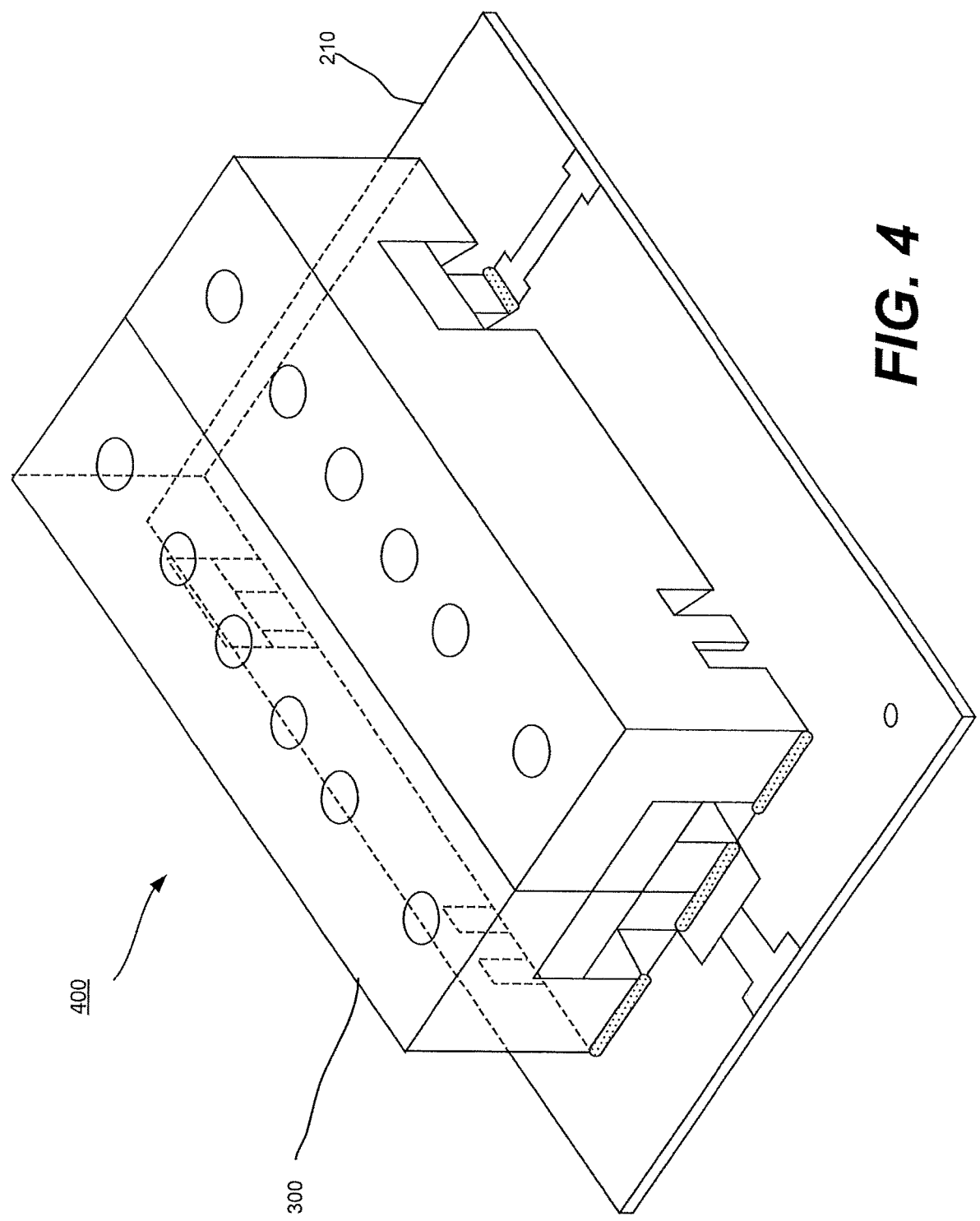
FIG. 4 illustrates a duplex filter on a printed circuit board according to an aspect of the application.

According to another aspect, the duplex filter 300 may be joined to a PCB 210 as shown in the system 400 of FIG. 4. The recitation of the filter and circuit board were provided above in the description. Here, the post 335 (as shown in FIG. 3) is coupled to the PCB 210 via solder as shown in FIG. 4. Circuit lines, connection pads, and terminals can be formed, for example, from metal such as copper. Terminals connect the filter 100 shown in FIGS. 1 and 2 with an external electrical circuit (not shown).

In some aspects of the application, electroplating may be selectively photo etched away on certain surfaces of the filter, such as on the recessed top and on ports, as well as on the inside of the side walls inside the recessed top. In the alternative, conductive paths may be defined by laser cutting. This enables given patterns to be achieved which provide connectivity for input ports, output ports, and other connections. It may further provide for electrical isolation between resonators, while also enabling coupling between resonators at operational frequencies of the filter.

Gaps in the filter, such as at side wall slot portions 122a' and holes 150a, as shown in FIG. 1, permit direct exposure of the printed pattern to the surrounding environment. The environment may contain dust, water vapor, and high conductivity gas, thus leaving the filter even more vulnerable to arcing between conductive elements on the top side of the filter. As previously discussed, peak power handling of ceramic RTP filters is limited by environmental conditions such as humidity and air pressure. Hermetically sealing a ceramic RTP filter within an enclosure, such as a container or housing, enables a controlled local environment for higher power handling and ensures that the local environment does not change over time, regardless of the exterior environment outside of the enclosure.

Thus, another aspect of the present application provides a way to environmentally isolate a ceramic filter. A broader range of additional applications may be addressed if cost effective means and method were available for providing for environmental isolation, enabling higher power operation of ceramic filters. Such applications would include micro and lower end macro class base stations.

Figure 5:
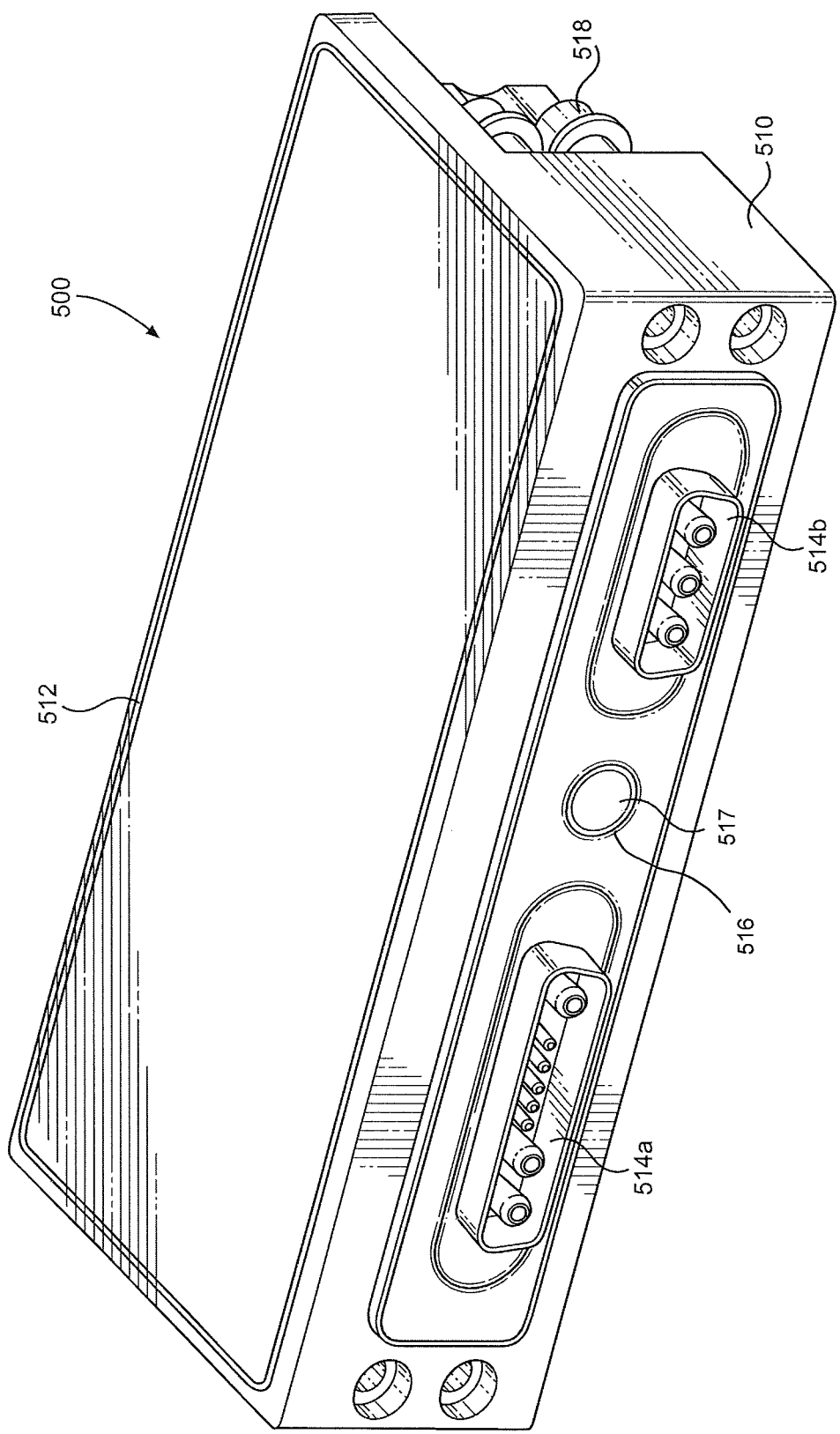
FIG. 5 shows a perspective view of a hermetically sealed enclosure in accordance with the application.

Referring to FIG. 5, a hermetically sealed enclosure 500 configured to environmentally isolate a ceramic filter is shown. The enclosure 500 is configured to enclose the filter in a controlled environment that does not change regardless of external changes in air pressure, humidity, gaseous content, and/or particulate exposure. The enclosure 500 includes a container body 510 and a container lid 512. The enclosure 500 may be fully assembled by placing components, such as electronic components, within the container body 510 and then welding the lid 512 shut. This may be carried out, for example, in a lab environment to create the hermetic seal for the enclosure so as to prevent dust, gas, moisture, and/or other foreign substances from entering into the enclosure. Welding the lid 512 to the container body 510 also makes the enclosure 500 tamper proof. The welded seal is a molten part of the enclosure, and as such, provides both thermal conductivity for heat sinking, and also act as an RF shield for blocking RF signals from getting into the enclosure as well as for preventing signals from emitting out of the enclosure. In some implementations, the lid 512 may be hermetically sealed to the container body 510 via epoxy or brazing.

Figure 6:
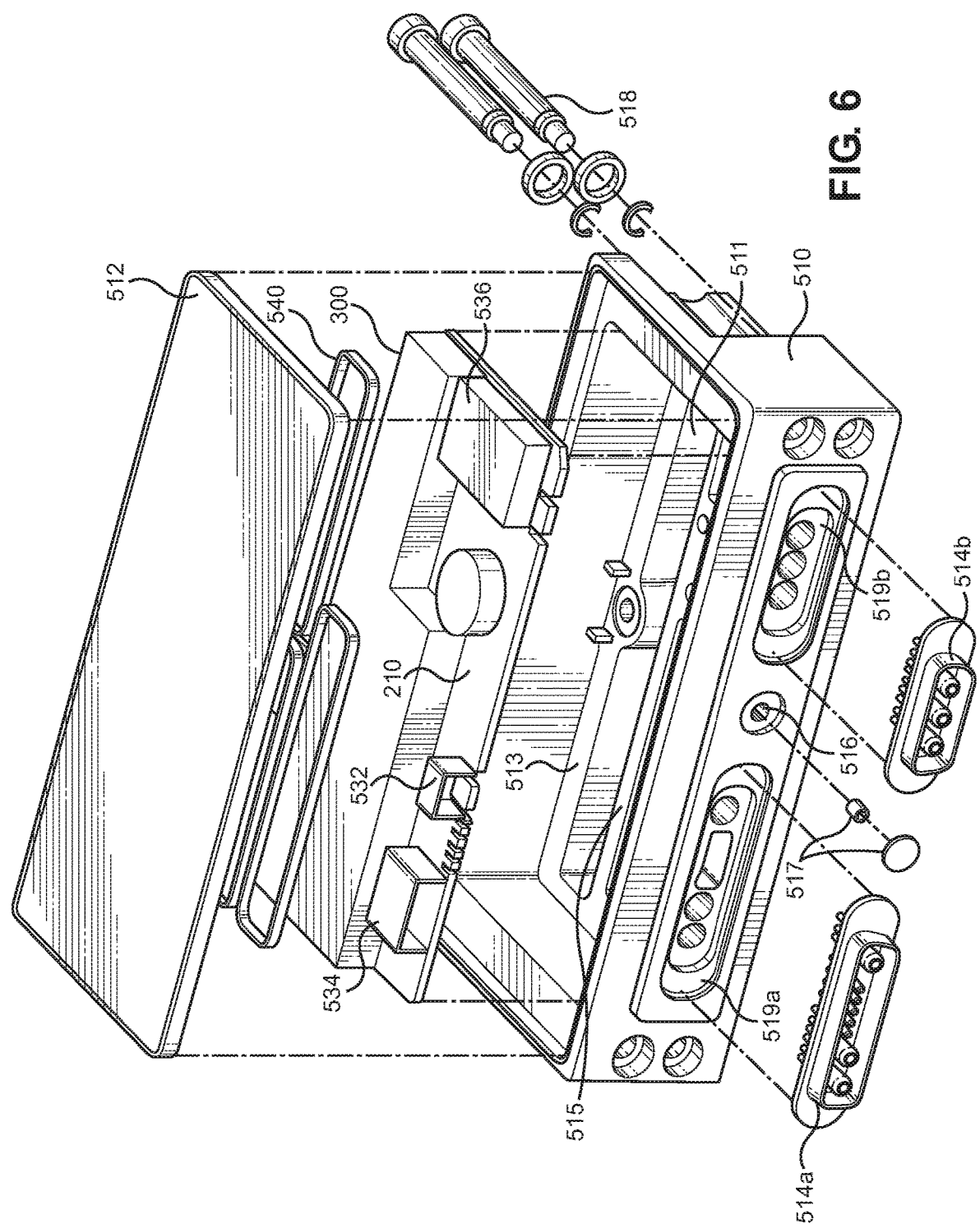
FIG. 6 shows an exploded view of the hermetically sealed enclosure of FIG. 5.

The hermetic enclosure 500 may include at least one hermetic connector 514a, 514b configured to transmit control signals, as well as RF and/or DC signals, into and out of the enclosure. In some implementations, the connectors 514a, 514b are provided in a wall of the container body 510. More specifically, the wall of the container body 510 may include corresponding connector ports 519a, 519b for receiving each respective connector 514a, 514b as shown in FIG. 6. Each connector 514a, 514b may be welded to the enclosure to ensure a hermetic seal. In other implementations, each connector 514a, 514b may be brazed or epoxied to the enclosure to create the hermetic seal.

The hermetically sealed enclosure 500 is further configured to allow the RF, DC and/or control signals to pass between units while maintaining a hermetic seal around the filter. Further, a plurality of fasteners 518, such as mounting screws and associated washers and/or retaining clips, may be provided to secure the hermetic enclosure 500 to a mounting rack or other device. The hermetic enclosure 500 further includes a vent port 516 configured to allow gas trapped inside the enclosure to be evacuated out and replaced with a dry, low conductivity, inert gas such as nitrogen, sulfur hexafluoride, or another filler gas.

According to one aspect of the present disclosure, the vent port 516 allows the lid to be welded shut in an environment with no special environmental requirements. This makes it easier to apply appropriate pressure on the lid 512 during laser welding, and also provides less restricted access to parts within the enclosure. The enclosure may be placed in an environment having dry nitrogen, dry air, or other pressurized filler gas. A vent cap 517 is used to cover the vent port 516. The vent cap 517 may be welded to the vent port 516 to ensure it is hermetically sealed. In other implementations, the vent cap 517 may be brazed or epoxied to the vent port 516 to create the hermetic seal.

As shown in FIG. 6, the container body 510 includes a cavity 511 defining a hollow space shaped and sized to receive various components and electronic circuitry. The cavity 511 is configured to receive a ceramic filter, such as a monoblock filter or a duplex filter 300 (as shown). In particular, the duplex filter 300 is mounted on a printed circuit board 210 along with other circuit components, including an environmental sensor 532 and a memory unit 534. The environmental sensor 532 is configured to monitor the internal pressure, humidity, and/or temperature within the enclosure 500. The memory unit 534 is configured to communicate with the environmental sensor 532, and/or record events that would indicate a failure of the hermetic seal of the enclosure.

Other circuitry may also be mounted on the printed circuit board 210, such as a low-noise amplifier 536. The low-noise amplifier 536 may be disposed near a receive port of the duplex filter 300. Additional electronic circuitry configured to detect, record, and/or alert other above-threshold conditions, such as the temperature and the RF power level occurring within the enclosure 500, may also be mounted on the printed circuit board 210.

An internal shoulder 513 extending into the cavity 511 from an inner surface of a wall of the container body 510 may be provided within the enclosure 500. The internal shoulder 513 may extend from a portion of the inner surface of the container body 510 or may extend from the entire inner periphery of the container body. The internal shoulder 513 is configured to support the printed circuit board 530 inside the container body 510. A support member 515 may also be provided within the container body 510 and configured to provide support to the printed circuit board 530. The support member 515 may protrude upward from a bottom surface of the container body.

In some implementations of the application, a filter seal 540 may be disposed within the cavity 511 of the enclosure 500. The filter seal 540 may be located between the duplex filter 300 and the lid 512 in order to thermally insulate the duplex filter, as well as the printed circuit board 210, from excess heat at the lid. The filter seal 540 is configured to keep heat away from the duplex filter 300, especially during high-power operations. Moreover, the filter seal is configured to shield RF energy coming from tune locations on the duplex filter 300, thereby preventing energy from the transmit portion of the filter from coupling into the receive portion of the filter, which could reduce filter performance if otherwise enclosed.

During assembly of the enclosure 500, the vent port 516 may be left open until a final step whereby the enclosure is placed in a vacuum chamber, evacuated, and replaced with a dry, low conductivity, inert gas such as nitrogen, sulfur hexafluoride, or other filler gas. Electrical arcs are known to happen based on gas pressure, gas type, and gap distance, according to Paschen's law. Some gases, such as nitrogen, provide a stronger breakdown voltage and are therefore used as a filler gas. Alternatively, the enclosure may be sealed under vacuum.

The enclosure 500 may be hermetically sealed after installation of all components within the container body. This permits operational tests to be performed before the enclosure is completely hermetically sealed. For instance, once the operational tests have been performed, the lid 511 may be hermetically sealed to the container body 510, i.e. by welding, brazing, or epoxy. Further, the connectors 514a, 514b may be hermetically sealed to respective connector ports 519a, 519b, i.e. by welding, brazing, or epoxy. Further, introduction of the filler gas within the cavity 511 can be accomplished through the vent port 516. The vent cap 517 is then hermetically sealed to the vent port 516, i.e. by welding, brazing, or epoxy, to maintain the hermetic environment within the enclosure. In some implementations, the vent port 516 may be sealed last so as to allow other assembly steps to be completed in an uncontrolled environment.

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

What is claimed is:

1. An enclosure comprising:
    a container body defining a hollow cavity configured to receive electronic components;
    a container lid sealed to the container body for providing a hermetic seal of the enclosure and for maintaining a controlled environment within the enclosure;
    a connector provided on the container body to permit communication between the electronic components received within the enclosure and other electronic components located outside the enclosure; and
    a filter provided within the hollow cavity of the container body and isolated from an outside environment, the filter including:
        a block of dielectric material with a top surface including a patterned region, a bottom surface, and side surfaces;
        a through-hole extending through the block from the top surface to the bottom surface, the through-hole being partially surrounded by the patterned region; and
        a wall extending from the top surface, the wall having an inner surface, an outer surface, and a top rim.

2. The enclosure according to claim 1, wherein the connector is hermetically sealed to the container body for maintaining the controlled environment within the enclosure.

3. The enclosure according to claim 1, further comprising an environmental sensor configured to monitor internal pressure, humidity, and/or temperature within the enclosure.

4. The enclosure according to claim 3, further comprising a memory unit configured to communicate with the environmental sensor and/or record events that indicate a failure of the hermetic seal of the enclosure.

5. The enclosure according to claim 1, wherein the wall includes a first post formed between two spaced-apart slots extending from the inner surface to the outer surface, and a second post formed between two other spaced-apart slots extending from the inner surface to the outer surface of the wall.

6. The enclosure according to claim 5, further comprising a printed circuit board having a top surface and including an input pad and an output pad on the top surface of the printed circuit board, wherein the input and output pads contact the first and second posts of the filter, respectively.

7. The enclosure according to claim 6, further comprising a thermal seal disposed within the hollow cavity and located between the filter and the container lid for thermally conducting heat away from the filter and to the lid.

8. The enclosure according to claim 1, wherein the bottom surface, side surfaces, and top surface of the block, and the outer surface of the wall respectively having a coating of silver and glass frit.

9. The enclosure according to claim 1, wherein the patterned region and the through-hole of the block and the inner surface of the wall respectively having a second coating of silver and glass frit.

10. The enclosure according to claim 1, further comprising a filler gas to prevent or minimize electrical arcing between the electronic components.

11. The enclosure according to claim 1, wherein the filter is a duplex filter.

12. The enclosure according to claim 11, wherein the filler gas is nitrogen or sulfur hexafluoride.

13. The enclosure according to claim 12, wherein the wall includes a post formed between the first and second slots.

14. The enclosure according to claim 1, wherein the wall extends along a perimeter of the top surface and includes a first slot extending therethrough from the inner surface to the outer surface, and a second, spaced-apart slot extending from the inner surface to the outer surface of the wall.

15. The enclosure according to claim 14, wherein the patterned region of the top surface of the block continuously extends to the post.

16. A system comprising:
    an enclosure configured to provide a hermetic seal and to maintain a controlled environment;
    a printed circuit board disposed within the enclosure, the printed circuit board having a top surface and including an input pad and an output pad on the top surface of the printed circuit board; and
    a filter mounted to the printed circuit board, the filter including:
        a block of dielectric material with a top surface including a patterned region, a bottom surface, and side surfaces,
        a through-hole extending through the block from the top surface to the bottom surface, and
        a wall extending from the top surface, the wall having an inner surface, an outer surface, and a top rim, the wall including a first post formed between two spaced-apart slots extending from the inner surface to the outer surface, and a second post formed between two other spaced-apart slots extending from the inner surface to the outer surface of the wall, wherein
        the bottom surface, side surfaces, and top surface of the block, and the outer surface of the wall respectively having a coating, and
        the
        the patterned region and the through-hole of the block and the inner surface of the wall respectively having a second coating.

17. The system according to claim 16, further comprising an environmental sensor mounted on the printed circuit board and configured to monitor internal pressure, humidity, and/or temperature within the enclosure.

18. The system according to claim 17, further comprising a memory unit mounted on the printed circuit board and configured to communicate with the environmental sensor and/or record events that indicate a failure of the hermetic seal of the enclosure.

19. A method of communicating a signal, the method comprising:
    providing a hermetically sealed enclosure containing a duplex filter mounted to a printed circuit board, the duplex filter including a pair of dielectric material blocks, each block having
        a top surface including a patterned region, a bottom surface, and side surfaces;
        a through-hole extending through the block from the top surface to the bottom surface, the through-hole being partially surrounded by the patterned region; and
        a wall extending from the top surface, the wall having an inner surface, an outer surface, and a top rim;
        wherein a cavity is a defined by the top surface and the wall;
    receiving the signal into the duplex filter from a first node outside of the enclosure;
    passing the signal through the through-hole; and transmitting the signal from the duplex filter to a second node outside of the enclosure.

20. The method according to claim 19, further comprising monitoring and recording internal pressure, humidity, and/or temperature within the enclosure.

* * * * *